(12) United States Patent
Goda et al.

(10) Patent No.: US 8,102,712 B2
(45) Date of Patent: Jan. 24, 2012

(54) NAND PROGRAMMING TECHNIQUE

(75) Inventors: Akira Goda, Boise, ID (US); Andrew Bickler, Boise, ID (US); Haitao Liu, Meridian, ID (US); Tomoharu Tanaka, Yokohama (JP)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 12/644,408

(22) Filed: Dec. 22, 2009

(65) Prior Publication Data
US 2011/0149654 A1 Jun. 23, 2011

(51) Int. Cl.
*G11C 11/34* (2006.01)
(52) U.S. Cl. .......... 365/185.17; 365/185.14; 365/185.28
(58) Field of Classification Search ............. 365/185.17, 365/185.14, 185.28
See application file for complete search history.

(56) References Cited

U.S. PATENT DOCUMENTS

| | | | |
|---|---|---|---|
| 2006/0067127 A1* | 3/2006 | Fasoli et al. | 365/185.18 |
| 2007/0279994 A1 | 12/2007 | Mokhlesi et al. | |
| 2008/0055994 A1* | 3/2008 | Guterman | 365/185.17 |
| 2008/0151633 A1 | 6/2008 | Park et al. | |

FOREIGN PATENT DOCUMENTS

| | | |
|---|---|---|
| GB | 2476549 A | 12/2009 |
| WO | 2008/015665 A1 | 2/2008 |
| WO | 2009/067357 A1 | 5/2009 |
| WO | 2010/051116 A1 | 5/2010 |

OTHER PUBLICATIONS

Combined Search and Examination Report for Untied Kingdom Patent Application No. 1020735.5, mailed on Apr. 21, 2011, 6 pages.

* cited by examiner

*Primary Examiner* — Hoai V Ho
*Assistant Examiner* — Anthan Tran
(74) *Attorney, Agent, or Firm* — Cool Patent, P.C.; Joseph P. Curtin

(57) ABSTRACT

A NAND memory array is programmed applying a programming voltage Vpgm as a double pulse programming pulse if a data pattern associated with memory cells that are to be programmed form a two-sided column-stripe (CS2) data pattern. The CS2 data pattern comprises a memory cell that is not to be programmed directly between two memory cells that are to be programmed, such that a channel associated with the memory cell that is not to be programmed has an applied boost voltage, and the channels associated with the two memory cells that are to be programmed have an applied programming voltage. The first memory cell of the two memory cells is programmed by the first programming voltage pulse and the second memory cell is programmed by the second programming voltage pulse. A programming voltage Vpgm is applied as a single pulse if a CS2 data pattern is not formed.

13 Claims, 12 Drawing Sheets

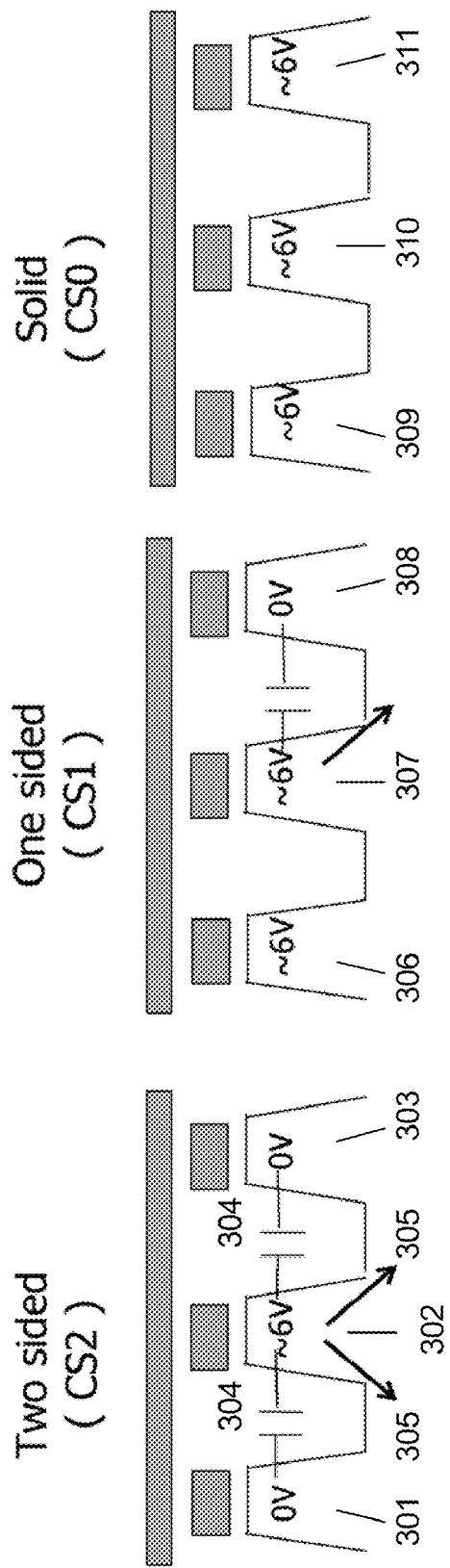

FIG. 4

| Bit lines (even/odd architecture) | Pgm_e0 | Pgm_e1 | Verify | Pgm_e | Verify |
|---|---|---|---|---|---|
| even_0 | Vbl_sel/Vbl_inh | Vbl_inh | Vbl_sense | Vbl_sel/Vbl_inh | Vbl_sense |
| odd_0 | Vbl_inh | Vbl_inh | Gnd | Vbl_inh | Gnd |
| even_1 | Vbl_sel/Vbl_inh | Vbl_inh | Vbl_sense | Vbl_sel/Vbl_inh | Vbl_sense |
| odd_1 | Vbl_inh | Vbl_inh | Gnd | Vbl_inh | Gnd |
| even_0 | Vbl_sel/Vbl_inh | Vbl_inh | Vbl_sense | Vbl_sel/Vbl_inh | Vbl_sense |
| odd_0 | Vbl_inh | Vbl_inh | Gnd | Vbl_inh | Gnd |
| even_1 | Vbl_inh | Vbl_sel/Vbl_inh | Vbl_sense | Vbl_sel/Vbl_inh | Vbl_sense |
| odd_1 | Vbl_inh | Vbl_inh | Gnd | Vbl_inh | Gnd |
| even_0 | Vbl_sel/Vbl_inh | Vbl_inh | Vbl_sense | Vbl_sel/Vbl_inh | Vbl_sense |
| odd_0 | Vbl_inh | Vbl_inh | Gnd | Vbl_inh | Gnd |
| even_1 | Vbl_inh | Vbl_sel/Vbl_inh | Vbl_sense | Vbl_sel/Vbl_inh | Vbl_sense |
| odd_1 | Vbl_inh | Vbl_inh | Gnd | Vbl_inh | Gnd |

401 — Bit lines (even/odd architecture)
402 — Pgm_e0, Pgm_e1, Verify
403 — Pgm_e, Verify Vbl_sel is typically 0 ~ 1V
Vbl_inh is typically ~Vcc(~2V)
Programmed Bit Line is biased at either Vbl_sel or Vbl_inh
Inhibited Bit Line is biased at Bbl_inh

FIG. 5

Bit lines
(all bit line architecture) — 501

| | Pgm_0 | Pgm_1 | Pgm_2 | Verify |
|---|---|---|---|---|
| BL_0 | Vbl_sel/Vbl_inh | Vbl_inh | Vbl_inh | Vbl_sense |
| BL_1 | Vbl_inh | Vbl_sel/Vbl_inh | Vbl_inh | Vbl_sense |
| BL_2 | Vbl_inh | Vbl_inh | Vbl_sel/Vbl_inh | Vbl_sense |
| BL_0 | Vbl_sel/Vbl_inh | Vbl_inh | Vbl_inh | Vbl_sense |
| BL_1 | Vbl_inh | Vbl_sel/Vbl_inh | Vbl_inh | Vbl_sense |
| BL_2 | Vbl_inh | Vbl_inh | Vbl_sel/Vbl_inh | Vbl_sense |
| BL_0 | Vbl_sel/Vbl_inh | Vbl_inh | Vbl_inh | Vbl_sense |
| BL_1 | Vbl_inh | Vbl_sel/Vbl_inh | Vbl_inh | Vbl_sense |
| BL_2 | Vbl_inh | Vbl_inh | Vbl_sel/Vbl_inh | Vbl_sense |
| BL_0 | Vbl_sel/Vbl_inh | Vbl_inh | Vbl_inh | Vbl_sense |
| BL_1 | Vbl_inh | Vbl_sel/Vbl_inh | Vbl_inh | Vbl_sense |
| BL_2 | Vbl_inh | Vbl_inh | Vbl_sel/Vbl_inh | Vbl_sense |

502

| | Pgm | Verify |
|---|---|---|
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |
| | Vbl_sel/Vbl_inh | Vbl_sense |

503

Vbl_sel/Vbl_inh = Vbl_sel or Vbl_inh
Vbl_sel is typically 0 ~ 1V
Vbl_inh is typically ~Vcc(~2V)
Programmed Bit Line is biased at either Vbl_sel or Vbl_inh
Inhibited Bit Line is biased at Bbl_inh

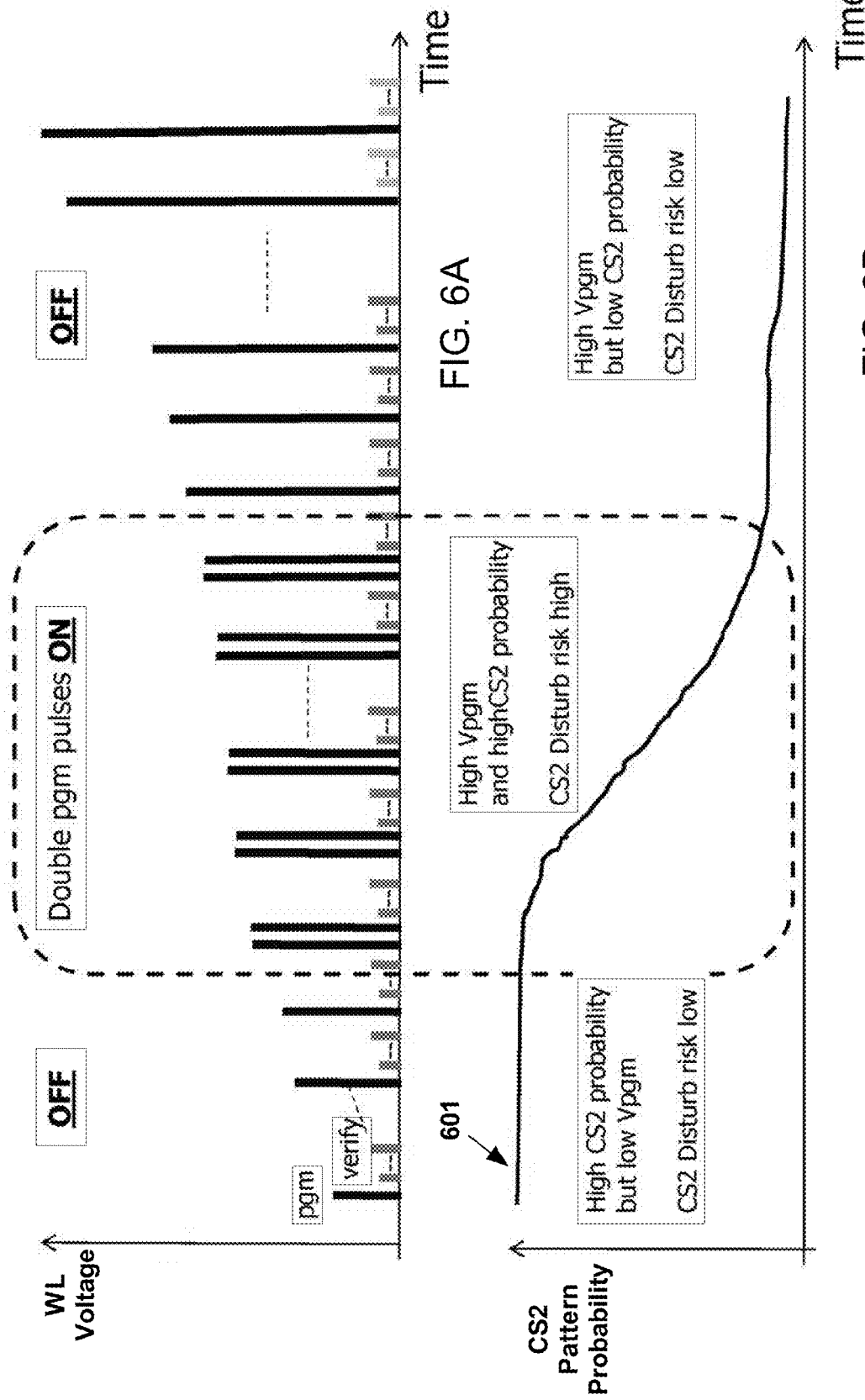

NAND PROGRAMMING TECHNIQUE

TECHNICAL FIELD

Embodiments described herein are generally directed to the field of programming techniques for NAND memory arrays and, more particularly, to programming techniques for eliminating program disturb failure that is based on a data pattern.

BACKGROUND

FIG. 1 shows a simplified schematic diagram of an exemplary portion of a column stripe pattern for a memory array 100 of a NAND Flash memory device. It should be understood that the exemplary portion of memory array 100 shown in FIG. 1 is for illustrative purposes and should not be taken as limiting and that other NAND memory array embodiments according to the subject matter disclosed herein are possible and will be apparent to those skilled in the art with the benefit of the present disclosure.

In FIG. 1, a series of NAND memory strings 120 are arranged in memory array 100 and are coupled to bit lines BL0-BL5 and source lines SL (of which only one source line SL is shown). In each NAND memory string 120, a series of floating-gate, or floating-node, FET memory cells 102 are coupled together source-to-drain to form NAND memory string 120 (typically having 8, 16, 32, or more cells). Each floating gate/node FET memory cell 102 has a gate-insulator stack formed over a channel region. To further enable operation, each NAND memory string 120 of memory array 100 is formed in an isolation trench (not shown), thereby allowing the substrate of each isolation trench to be individually biased in a well-known manner for programming and erasure.

Word lines WL0-WL65 cross the NAND memory strings 120 and couple the control gates of memory cells 102 in adjacent memory strings 120 in order to enable, or select, a single memory cell 102 in each NAND memory string 120. In each NAND memory string 120, impurity doped regions (typically an N+ impurity) are formed between each gate insulator stack to form the source and drain regions of the adjacent memory cells 102, which additionally operate as connectors to couple the cells of the NAND string 120 together. In an exemplary alternative embodiment, the N+ doped regions are omitted and a single channel region is formed under a NAND memory string 120, thereby coupling the individual memory cells 102. Each NAND memory string 120 is coupled to select gates 104 that are formed at either end of each NAND memory string 120 and selectively couple opposite ends of each NAND memory string 120 to a bit line BL and to a source line SL. The select gates 104 are each coupled to gate select lines, i.e., select gate drain SDS and select gate source SGS, that control the coupling of NAND memory strings 120 to the bit lines BL and source lines SL, respectively, through select gates 104.

NAND memory array 100 is accessed in a well-known manner by a row decoder (not shown) that activates a row of memory cells by selecting a particular word select line WL that is coupled to the gates of the memory cell row. Word lines WL coupled to the gates of the unselected memory cells of each NAND memory string 120 are also driven. The unselected memory cells of each NAND memory string 120 are, however, typically driven by a higher gate voltage to operate them as pass transistors, thereby allowing them to pass current in a manner that is unrestricted by their stored data values. Current then flows from the source line SL to the column bit line BL through each floating gate/node memory cell of the series-coupled NAND memory string. The current that flows in the respective bits lines BL is restricted only by the stored data values of the row of selected memory cells. A column page of bit lines is selected and sensed, and then individual data words are selected from the sensed data words from the column page and communicated from the memory device.

In some exemplary embodiments, NAND memory array 100 is configured so that even numbered bit lines (i.e., BL0, BL2, BL4, etc.) are configured as part of an even column page, and odd numbered bit lines (i.e., BL1, BL3, etc.) are configured as part of an odd column page. In other exemplary embodiments, NAND memory array 100 is configured as an array without an even and odd column page arrangement.

The conventional programming technique for Flash/EEPROM memories program a bit or row (commonly referred to as a page) of a NAND memory array by applying a programming voltage or series of programming voltage pulses to the control gates of the selected memory cells and programming (or inhibiting) the selected memory cells to either program (set at logical "0" by the injection of charge to the floating gate or floating node of a memory cell) or inhibit (not program, usually intended to leave the cell erased and set at logical "1") by coupling their channels to either a program or inhibit voltage.

In conventional programming operations in a NAND architecture Flash/EEPROM memory arrays, such as depicted by NAND memory array 100, a programming voltage is coupled to a word line WL that is coupled to the gate of the selected memory cell of a NAND memory string 120. The word lines WL coupled to the gates of the unselected memory cells of each NAND memory string 120 are also driven by a pass gate voltage Vpass in order to operate the unselected memory cells of the memory string 120 as pass transistors, and to generate a channel of carriers by capacitive coupling in the unselected memory cells so that the unselected memory cells pass current in a manner that is relatively unrestricted by their respectively stored data values. The NAND memory string 120 is then typically coupled to a bit line BL (or a source line SL) that has a program voltage placed upon it. The applied pass voltage Vpass also allows generation of a channel of carriers in the NAND memory string 120 and allows the memory cell that was selected for programming to couple through this channel of carriers to the bit line BL (or the source line SL), thereby applying a field that across the memory cell selected for programming that causes carriers to tunnel to the floating gate, or charge trapping layer, altering the threshold voltage level Vt of the selected memory cell and storing the data value. If a program-inhibit voltage is placed upon the coupled bit line BL or source line SL (also referred to as boosting), the applied field generated by the program-inhibit voltage is selected to be insufficient to tunnel carriers to the floating gate/node, and no data value is programmed and the memory cell remains in the erased state.

After programming the selected memory cell(s), a verify operation is then performed to confirm that the data was successfully programmed. If the programmed memory cell(s) of the erase block fail verification, the program and verify cycle is repeated until the data is successfully programmed or a selected number of iterations have passed and the programming operation is deemed to have failed.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 3A-3C respective depict cross-sectional views of three channels 301-303 forming different data patterns according to the subject matter disclosed herein;

FIG. 4 contrasts an exemplary embodiment of a programming process that accounts for CS2 data patterns during programming according to the subject matter disclosed herein against a conventional programming process;

FIG. 5 contrasts another exemplary embodiment of a programming process that accounts for CS2 data patterns during programming according to the subject matter disclosed herein against a conventional programming process;

FIGS. 6A and 6B respectively depict a programming progression of a NAND array and the relative probability of a CS2 data pattern during programming according to the subject matter disclosed herein;

Figure 1:
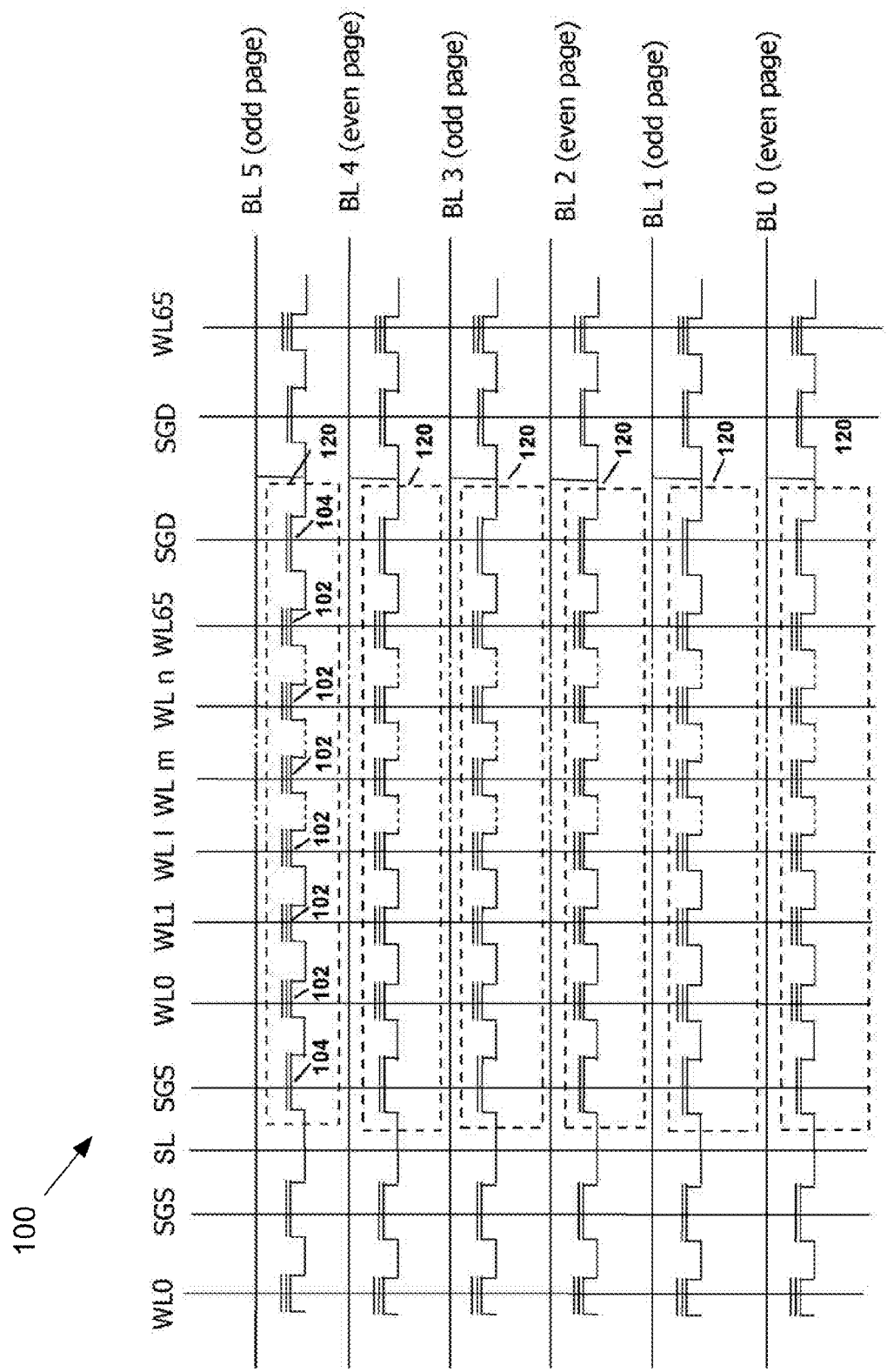
FIG. 1 shows a simplified schematic diagram of an exemplary portion of a column stripe pattern for a memory array 100 of a NAND Flash memory device.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DETAILED DESCRIPTION

Embodiments of techniques described herein relate to programming techniques for programming an NAND memory array in order to eliminate program disturb failure associated with a particular data pattern. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

The subject matter disclosed herein relates to programming techniques for programming an NAND memory array in order to eliminate program disturb failure for a particular data pattern. When a NAND memory array, such as the exemplary NAND array shown in FIG. 1, is configured in a column page arrangement in which even-numbered bit lines (NAND memory strings) are part of an even column page and odd-numbered bit lines (NAND memory strings) are part of an odd column page, the boosting efficiency of a channel during programming can be degraded when a non-boosted channel (at about 0 V) is adjacent on both sides of a boosted channel (at about 6 V) possibly causing program disturb failure, that is, when the boosted channel is directly between two non-boosted channels. The data pattern in which a boosted channel is directly between two non-boosted channels is referred to herein as a two-sided column-stripe (CS2) data pattern. The boosting efficiency degradation is caused by the capacitive coupling between the boosted channel and the adjacent non-boosted channels. Additionally, the potential different between the boosted channel and the adjacent non-boosted channels can develop an electric field that can cause junction leakage leading to loss of the boosting voltage. Thus, the occurrence of a CS2 data pattern increases the likelihood of a program disturb failure. Program disturb failures caused by a CS2 data pattern are referred to herein as a CS2 disturb failures.

Figure 2:
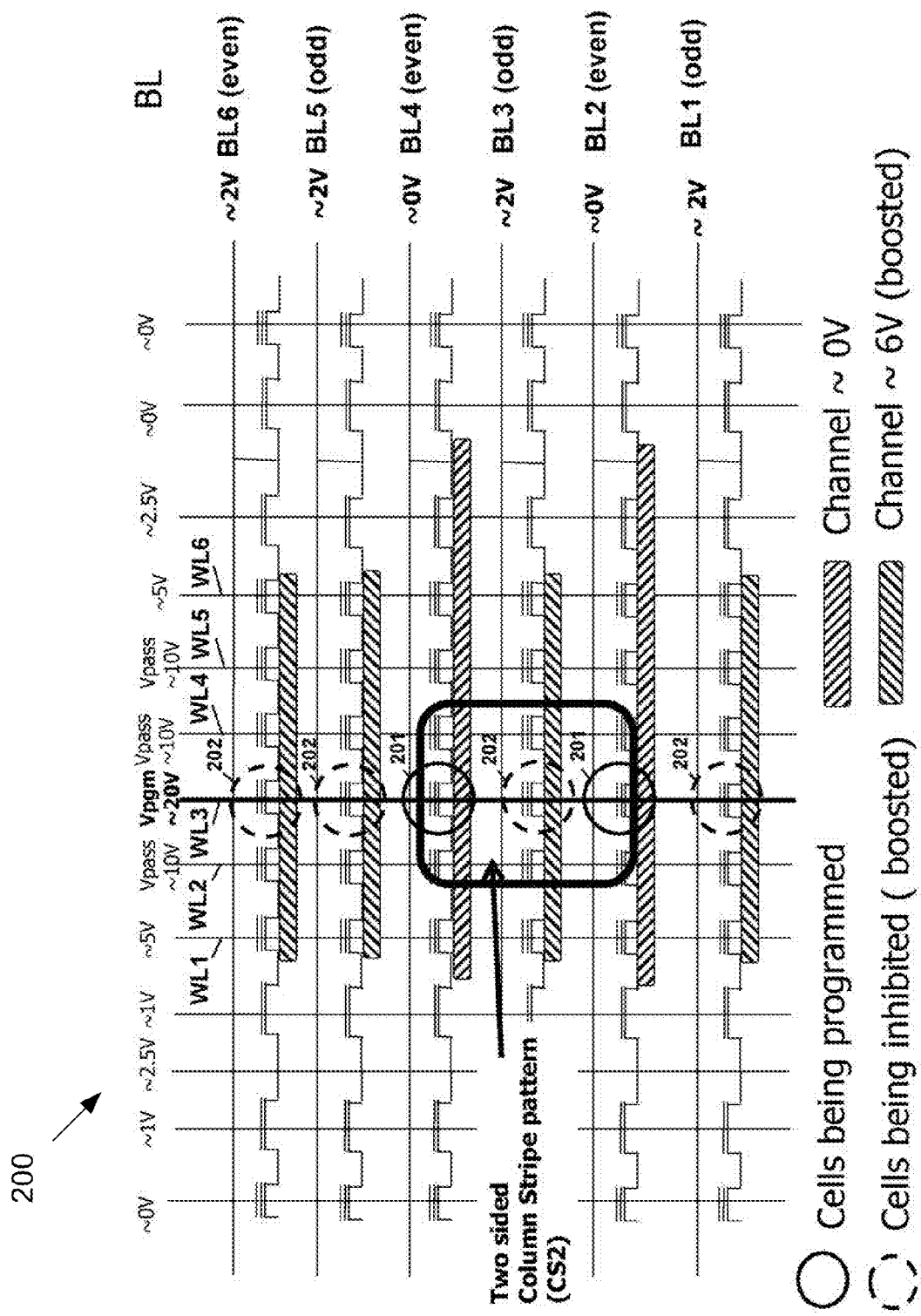
FIG. 2 shows a simplified schematic diagram of a portion of a column stripe pattern of a NAND memory array 200 to better illustrate a two-sided column-stripe (CS2) data pattern.

FIG. 2 shows a simplified schematic diagram of a portion of a column stripe pattern of a NAND memory array 200 to better illustrate a two-sided column-stripe (CS2) data pattern. The portion of NAND memory array 200 shown in FIG. 2 includes only six bit lines BL1-BL6 and only six word lines WL1-WL6. Other lines, such as select lines are not identified in FIG. 2 for clarity of FIG. 2. The odd bit lines BL1, BL3 and BL5 are arranged to be part of an odd column page, and the even bit lines BL2, BL4 and BL6 are arranged to be part of an even column page. It should be understood that memory array 200 is for illustrative purposes and should not be taken as limiting and that other NAND memory array embodiments could include a two-sided column-stripe data pattern similar to that depicted in FIG. 2.

To illustrate a CS2 data pattern, consider a situation in which a programming voltage Vpgm of about 20 V is applied to word line WL3 in order to program memory cells 201. Word line WL3 is also coupled to a number of other memory cells 202, which, for this example, are not to be programmed. Memory cells 201, which are to be programmed and in this instance, are part of an even column page, are indicated by a circle formed by a solid-line. Memory cells 202, which are not to be programmed, are indicated by a circle formed by a dashed-line. The memory cells 202 that are coupled to bit lines BL1, BL3 and BL5 are part of an odd column page. Memory cell 202, which is coupled to bit line BL6, is part of the even column page. Because memory cells 201 are to be programmed, the channel passing under the two memory cells 201 is coupled to 0 V in a well-known manner through their respective bit lines. The blocks of hatching shown along bit lines BL2 and BL4 represent channels that have been coupled to 0 V. In contrast to memory cells 201, the channels passing under memory cells 202, which are not to be programmed, are floating because the select gates are turned off on those bit lines and are boosted to about 6 V by capacitive coupling to the WL voltages of Vpass at about 10 V. Bit lines BL1, BL3 and BL5 are inhibited because the odd page is unselected. Bit line BL6 is inhibited because its programming is complete. Accordingly, the blocks of hatching shown along bit lines BL1, BL3, BL5 and BL6 represent channels that have been boosted to about 6 V. A CS2 data pattern is indicated within the area enclosed by a solid line.

FIG. 3A depicts a cross-sectional view of three channels 301-303 forming a CS2 data pattern according to the subject matter disclosed herein. In particular, channel 302, which is boosted to about 6 V, is directly between channels 301 and 303, which are not boosted and are at 0 V in order to be programmed. Channels 301-303 depicted in FIG. 3A correspond to the channels coupled to bit lines BL2-BL4. The boosting efficiency of channel 302 is degraded because of the capacitive coupling, as represented by capacitors 304, between boosted channel 302 and the adjacent non-boosted channels 301 and 303. Additionally, the potential different between boosted channel 302 and the adjacent non-boosted channels 301 and 303 can develop an electric field that can cause junction leakage, as represented by arrows 305, leading to loss of the boosting voltage.

At the beginning of the programming process when the NAND memory array, such as NAND memory array 100 in FIG. 1, is completely unprogrammed, the probability of a CS2 data pattern is relatively high. As programming proceeds and more of the NAND memory array becomes programmed, the probability of a CS2 data pattern gradually begins to be reduced (depending on the size of the memory array), and the probability increases for a one-sided column-stripe (CS1) data pattern (FIG. 3B) or a zero-sided column-stripe (CS0) data pattern (FIG. 3C). FIG. 3B depicts a cross-sectional view of three channels 306-308 forming a CS1 data pattern according to the subject matter disclosed herein. Channels 306 and 307 are boosted to about 6 V, and channel 308 is not boosted and is at about 0 V. FIG. 3C depicts a cross-sectional view of three channels 309, 310 and 311 that are all boosted to about 6 V. For a CS1 data pattern, the boosting efficiency is not as degraded as for a CS2 data pattern. For a CS0 data pattern, the boosting efficiency is not degraded.

Accordingly, the subject matter disclosed herein provides a programming process that accounts for CS2 data patterns during programming, and thereby improves boosting efficiency of a channel during programming by eliminating CS2 disturb failures.

FIG. 4 contrasts an exemplary embodiment of a programming process that accounts for CS2 data patterns during programming according to the subject matter disclosed herein against a conventional programming process. In FIG. 4, an exemplary arrangement of bit lines for an even and an odd page architecture is depicted at 401. Bit lines for the even page are depicted as solid lines and bit lines for the odd page are depicted as dashed lines. For this example, the even page is to be programmed and verified. At 402 in FIG. 4, every other even bit line (i.e., the bit lines designated as even_0) are programmed during a first programming pulse Pgm_e0. During a second programming pulse Pgm_e1, the bit lines designated as even_1 are programmed. Progress through the programming process is indicated by the arrow at the top of the center of FIG. 4. All of the bit lines of the even page are verified together. By this approach, there are no CS2 data patterns that can cause a program disturb failure. The same technique would be used for programming the bit lines of the odd page. That is, the bit lines of the odd page would be grouped in an alternating manner and each group would be programmed in a segmented manner. All of the bit lines of the odd page would be verified together. In contrast, at 403 in FIG. 4, a conventional programming process would program all of the bit lines of the even page (designated as both even_0 and even_1) during a single program pulse Pgm_e. Progress through the conventional programming process is indicated by the arrow at the top of the right of FIG. 4. By the conventional approach, there will be CS2 data patterns that can cause a program disturb failure.

FIG. 5 contrasts another exemplary embodiment of a programming process that accounts for CS2 data patterns during programming according to the subject matter disclosed herein against a conventional programming process. In FIG. 5, an exemplary arrangement of bit lines an all bit line architecture is depicted at 501. To illustrate the programming process according to the subject matter disclosed herein, the bit lines have been designated as BL_0, BL_1 and BL_2. At 502 in FIG. 5, every bit line designed as BL_0 is programmed during a first programming pulse Pgm_0. During a second programming pulse Pgm_1, every bit line designated as BL_1 is programmed. During a third programming pulse Pgm_2, every bit line designated as BL_2 is programmed. Progress through the programming process is indicated by the arrow at the top of the center of FIG. 5. All of the bit lines are then verified together. By this approach, there are no CS2 data patterns that can cause a program disturb failure. In contrast, at 503 in FIG. 5, a conventional programming process would program all of the bit lines during a single program pulse Pgm. Progress through the conventional programming process is indicated by the arrow at the top of the right of FIG. 5. By the conventional approach, there will be CS2 data patterns that can cause a program disturb failure.

FIGS. 6A and 6B respectively depict a programming progression of a NAND array and the relative probability of a CS2 data pattern during programming according to the subject matter disclosed herein. At the origin in FIG. 6A, the programming process of an NAND array, such as NAND array 100 in FIG. 1, begins. At one extreme, the two column pages of the NAND array are completely unprogrammed; consequently the probability of a CS2 data pattern (FIG. 3A) is very high, as represented by the position of relative probability curve 601 near the origin of FIG. 6B. It should be understood, though, that the programming process does not need to start with the NAND array completely unprogrammed. Because the probability of a CS2 data pattern is very high, the programming process uses a relatively low Vpgm to reduce the risk of a CS2 disturb failure. The relatively low Vpgm is represented on the left side of FIG. 6A as a relatively low voltage pulse (i.e., a short vertical bar). After a programming pulse, verify is performed in a well-known manner after a programming pulse, as represented by a series of verify pulses.

As programming proceeds in FIG. 6A, FIG. 6B shows that the probability of a CS2 data pattern begins to be gradually reduced. In some cases, as programming proceeds, a CS2 data pattern (FIG. 3A) may occur. In other cases, a one-sided column-stripe (CS1) data pattern (FIG. 3B) may occur or a zero-sided column-stripe (CS0) data pattern (FIG. 3C) may occur. At the same time while programming proceeds, the Vpgm voltage is gradually increased to account for the increased programming voltage required to program a memory cell as more of the memory array becomes programmed. During this stage of the programming process, a single-pulse programming technique is used, as indicated by the area to the left of the area enclosed by the dashed line extending between FIGS. 6A and 6B.

As the programming process proceeds, at some point during the programming process the probability of a CS2 data pattern begins to be reduced at a greater rate and, as indicated by the area enclosed within the dashed line extending between FIGS. 6A and 6B, a double-pulse programming technique according to the subject matter disclosed herein is used that accounts for reduced the probability of CS2 data patterns, and which improves boosting efficiency of a channel during programming and reduces the probability of CS2 disturb failures. The double-pulse technique according to the subject matter disclosed herein uses two programming pulses to sequentially program two memory cells that are separated by a channel that has a boosted (inhibit) voltage (i.e., FIG. 3A). That is, referring to FIG. 3A, when a CS2 data pattern exists, a first programming pulse is used to program the memory cell associated with channel 301 and a second programming pulse is used to program the memory cell associated with channel 303. While the double-pulse programming technique lengthens the programming process, the double-pulse programming technique advantageously reduces the probability of CS2 disturb failures by creating CS1 data patterns.

As the programming process continues, the probability of a CS2 data pattern becomes relatively low, even though the programming voltage Vpgm has been gradually increased, but the risk of a CS2 disturb failure is low. Consequently, the double-pulse programming technique is not needed and the programming process returns to a single-pulse programming technique. This portion of the programming process is indicated by the area the right of the area enclosed by the dashed line extending between FIGS. 6A and 6B.

At the beginning of the programming process of a NAND array, the probability of encountering a CS2 data pattern is relatively high, so the double-pulse programming technique of the subject matter disclosed herein could be used for the entire programming process; however, because a lower programming voltage Vpgm is used, the probability of a CS2 disturb failure is relatively low. Consequently, the advantages of the reduced probability for a CS2 disturb failure obtained by using the double-pulse programming technique may be outweighed by the increase in the overall time of the programming process.

According to the subject matter disclosed herein, there are three main techniques that can be used for determining when the double-pulse programming technique should be used during a NAND programming process. The first main technique is based on the progress of the programming process as based on a loop count, that is, the number of program pulses a particular page is to receive. The second main technique for determining when the double-pulse programming technique should be used is based on a relative magnitude of the programming voltage Vpgm. The third main technique is based on the detection of a CS2 data pattern. It should be understood that other techniques for determining when the double-pulse programming technique should be used could be based on a combination of at least two or more of the three main techniques.

Figure 7:
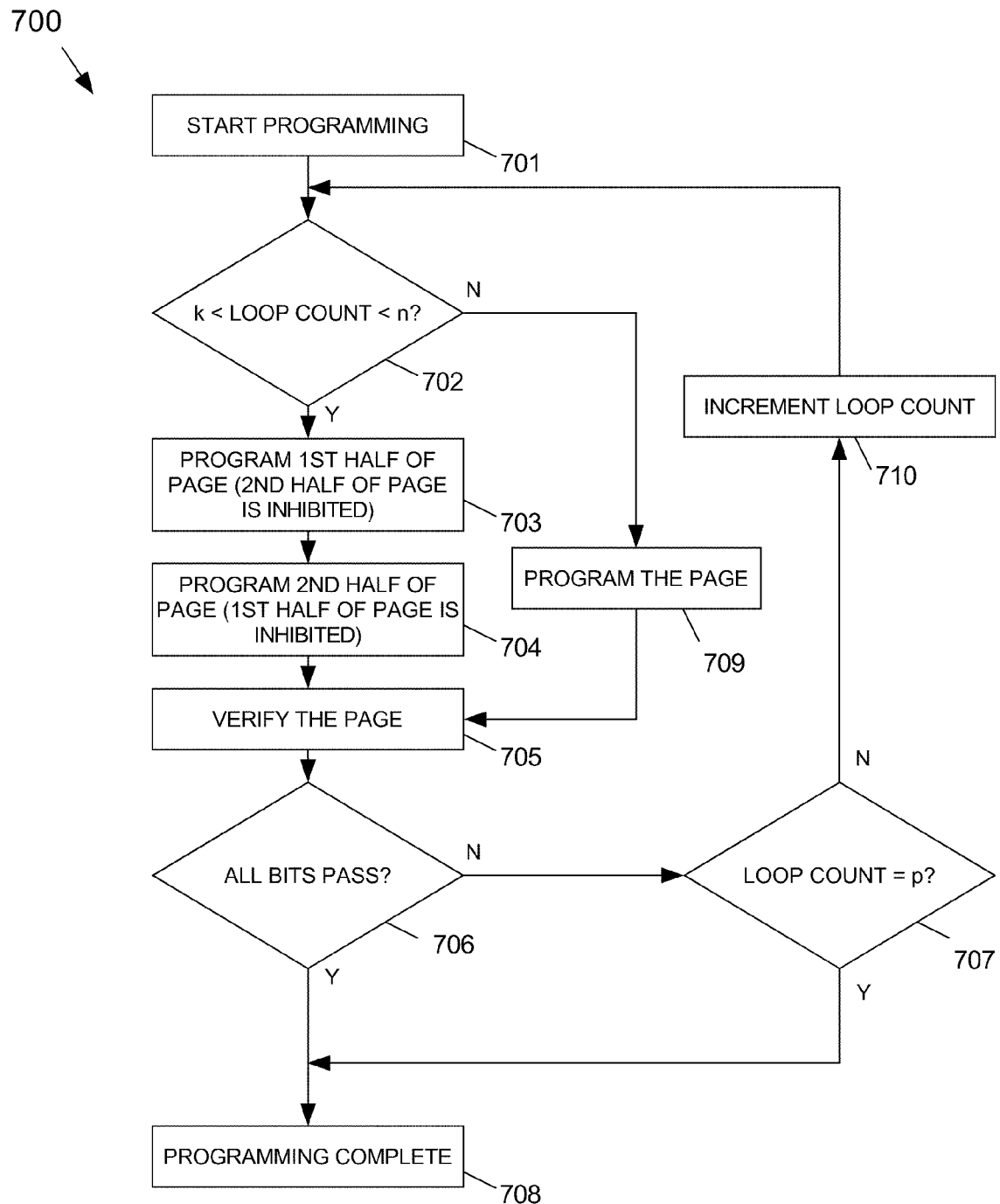
FIG. 7 shows a flow diagram of an exemplary embodiment of a programming process of a page of a NAND memory array based on a determination of progress through the programming process (a loop count) according to the subject matter disclosed herein
Figure 8:
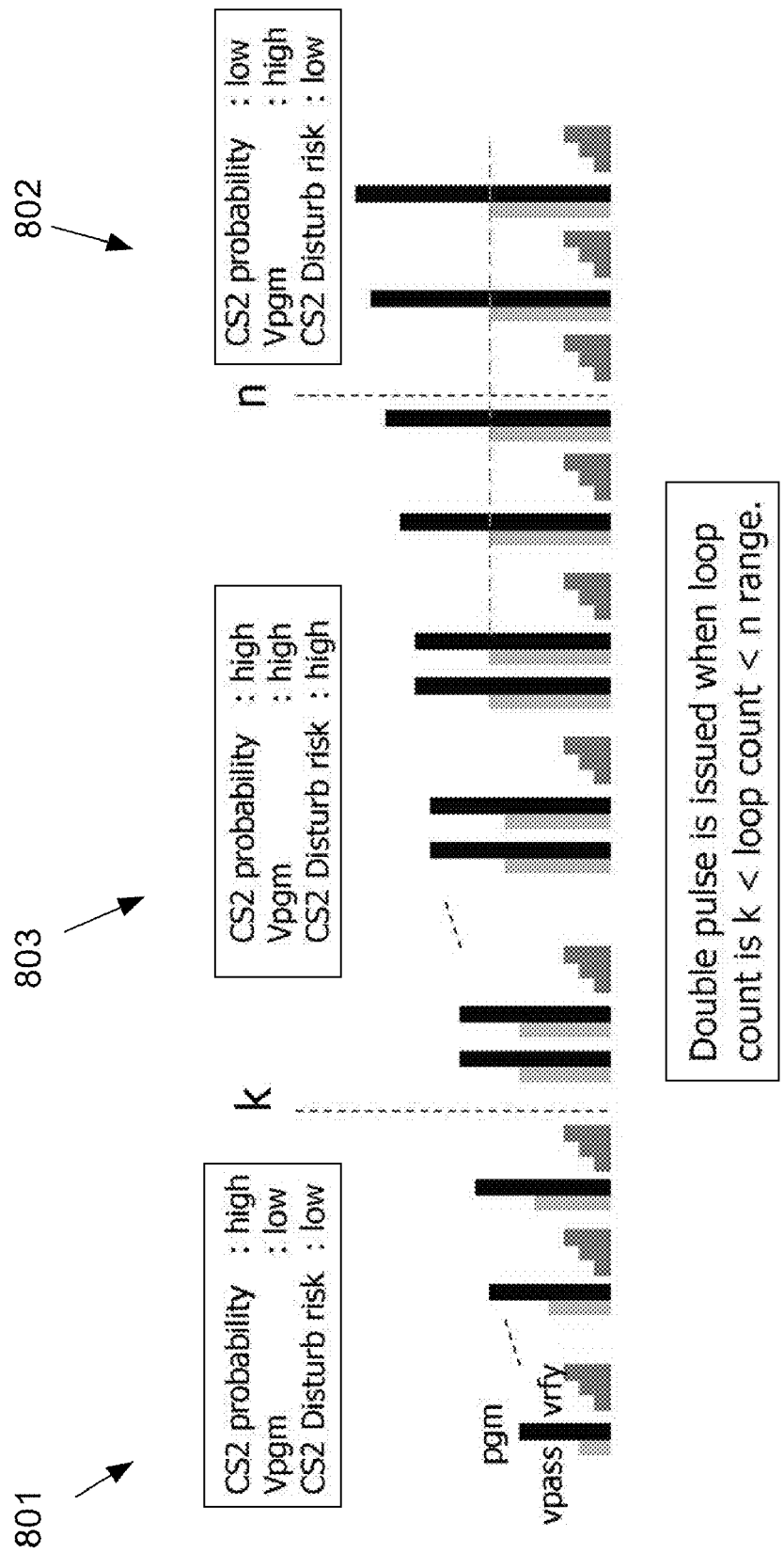
FIG. 8 is a depiction of the process of flow diagram of FIG. 6 when the determination to use the double-pulse programming technique is based on progress through the programming process (i.e., a loop count)

FIG. 7 shows a flow diagram 700 of an exemplary embodiment of a programming process of a page of a NAND memory array based on a determination of progress through the programming process (a loop count) according to the subject matter disclosed herein. FIG. 8 is a depiction of the process of flow diagram 700 of FIG. 7 when the determination to use the double-pulse programming technique is based on progress through the programming process (i.e., a loop count). At step 701, the programming process begins and a variable Loop Count is set to 1. As used herein, Loop Count is the number of program pulses a particular page is to receive. The process flows to step 702 where it is determined whether the whether Loop Count, i.e., the number of programming passes through the programming process of a column page of NAND memory array, exceeds a predetermined number k and is less than a predetermined number n. In one exemplary embodiment, the particular values chosen for k and n could depend on observed manufacturing variations within a given manufacturing lot that contribute to a NAND memory array being susceptible to CS2 disturb failure. In another exemplary embodiment, the particular values chosen for k and n could depend on observed manufacturing variations taken over a large number of manufacturing lots that contribute to a NAND memory array being susceptible to CS2 disturb failure.

If, at step 702, Loop Count is either less than k or greater than n, the process flows to step 709 where the NAND column page is programmed using a conventional single-pulse programming technique. Step 709 corresponds to the area to the left of or to the area to the right of the area enclosed by the dashed line extending between FIGS. 6A and 6B. This is also depicted by area 801 in FIG. 8. When step 709 corresponds to the area to the left of the area enclosed by the dashed line extending between FIGS. 6A and 6B, the probability of a CS2 data pattern is relatively high, but the probability of a CS2 disturb failure is relatively low because the programming voltage Vpgm is relatively low. This is also depicted by area 802 in FIG. 8. When step 709 corresponds to the area to the right of the area enclosed by the dashed line extending between FIGS. 6A and 6B, the programming voltage Vpgm is relatively high, but the probability of a CS2 disturb failure is relatively low because the probability of a CS2 data pattern is relatively low.

If, at step 702, Loop Count is greater than k and less than n, the process flows to step 703 where the first half of the NAND column page is programmed while the second half of the NAND column page is inhibited. That is, when the process flows from step 702 to step 703, it has been determined to use the double-pulse programming technique disclosed herein because both the probability that a CS2 data pattern is relatively high and the programming voltage Vpgm is relatively high; consequently the probability of a CS2 disturb failure is relatively high if a conventional single-pulse programming technique is used. Once step 703 is complete, flow continues to step 704 where the second half of the NAND column page is programmed while the first half of the NAND column page is inhibited. Steps 703 and 704 correspond to the area enclosed within the dashed line extending between FIGS. 6A and 6B. This is also depicted by area 803 in FIG. 8.

Regardless which path the process flow has taken from step 702, the programming is verified at step 705. Flow continues to step 706 where it is determined whether the programming performed in steps 703 and 704, or step 709 is verified. If, at step 706, it is determined that the programming is verified, flow continues to step 708 where the programming process of the page of the NAND memory array is complete. If, at step 706, it is determined that the programming is not verified, flow continues to step 707 where it is determined whether the programming process for the column page is complete, that is, whether the Loop Count equals the number of rows p in the column page. If, at step 707, it is determined that Loop Count does not equal p, then flow continues to step 710 where the Loop Count is incremented. Flow then continues to step 702. If, at step 707, it is determined that Loop Count equals p, then flow continues to step 708 where the programming process of the page of the NAND memory array is complete.

Figure 9:
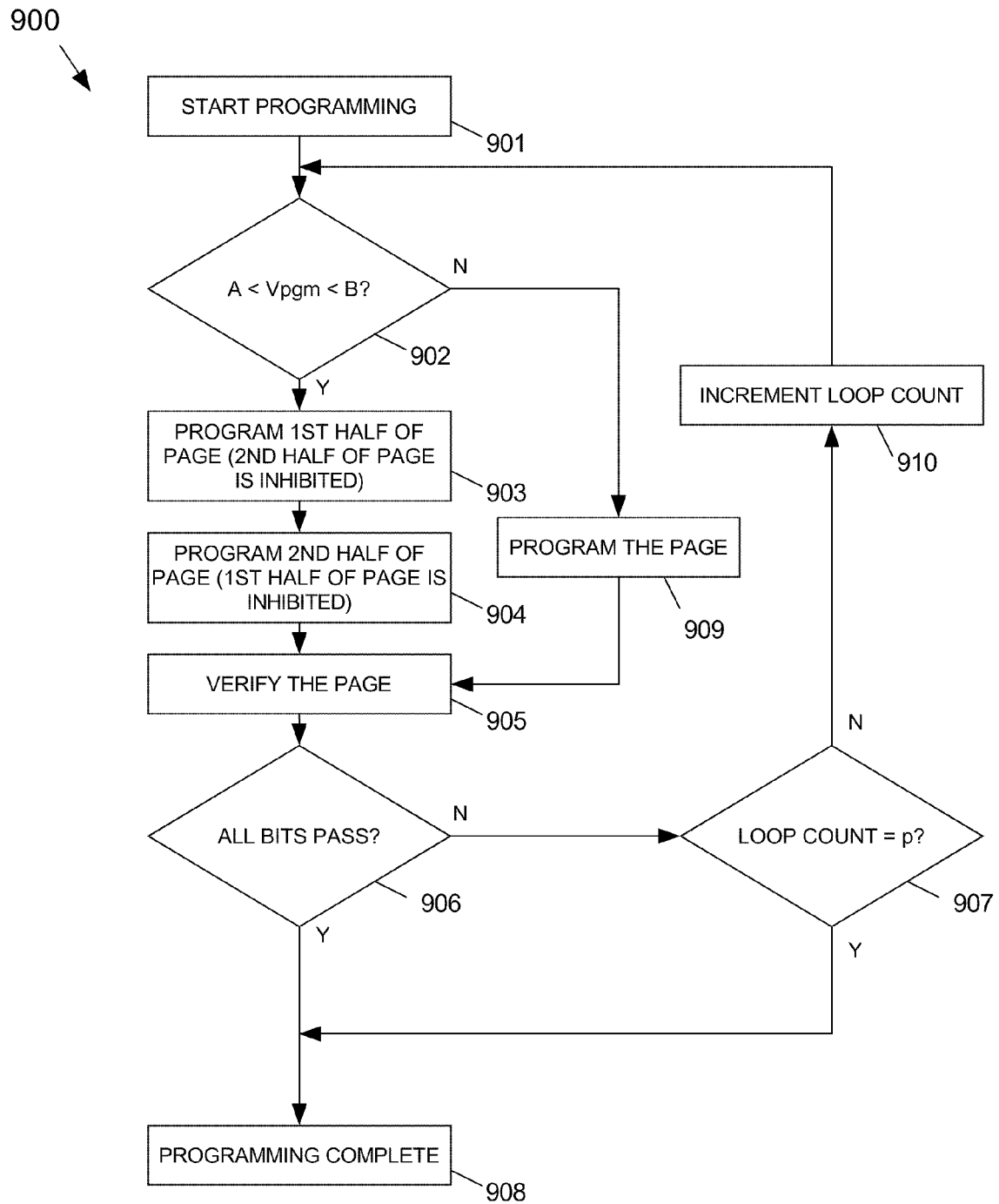
FIG. 9 shows a flow diagram of an exemplary embodiment of a programming process of a page of a NAND memory array based on a determination of is based on a determination of the magnitude of the programming voltage Vpgm according to the subject matter disclosed herein.

FIG. 9 shows a flow diagram 900 of an exemplary embodiment of a programming process of a page of a NAND memory array based on a determination of is based on a determination of the magnitude of the programming voltage Vpgm according to the subject matter disclosed herein. At step 901, the programming process begins and a variable Loop Count is set to 1. The process flows to step 902 where it is determined whether the whether the program voltage Vpgm is greater than voltage A and less than voltage B. In one exemplary embodiment, the particular values chosen for A and B could depend on observed manufacturing variations within a given manufacturing lot that contribute to a NAND memory array being susceptible to CS2 disturb failure. In another exemplary embodiment, the particular values chosen for A and B could depend on observed manufacturing variations taken over a large number of manufacturing lots that contribute to a NAND memory array being susceptible to CS2 disturb failure.

If, at step 902, program voltage Vpgm is either less than A or greater than B, the process flows to step 909 where the NAND column page is programmed using a conventional single-pulse programming technique. Step 909 corresponds to the area to the left of or to the area to the right of the area enclosed by the dashed line extending between FIGS. 7A and 7B.

If, at step 902, program voltage Vpgm is greater than A and less than B, the process flows to step 903 where the first half of the NAND column page is programmed while the second half of the NAND column page is inhibited. That is, when the process flows from step 902 to step 903, a decision has been made to use the double-pulse programming technique disclosed herein because both the probability that a CS2 data pattern is relatively high and the programming voltage Vpgm is relatively high; consequently the probability of a CS2 disturb failure is relatively high if a conventional single-pulse programming technique is used. Once step 903 is complete, flow continues to step 904 where the second half of the NAND column page is programmed while the first half of the NAND column page is inhibited. Steps 903 and 904 correspond to the area enclosed by the dashed line extending between FIGS. 6A and 6B.

Regardless which path the flow has taken from step 902, the programming is verified at step 905. Flow continues to step 906 where the programming performed in steps 903 and 904, or step 909 is verified. If, at step 906, it is determined that the programming is verified, flow continues to step 908 where the programming process of the page of the NAND memory array is complete. If, at step 906, it is determined that the programming is not verified, flow continues to step 907 where it is determined whether the programming process for the column page is complete, that is, whether the Loop Count equals the number of rows p in the column page. If, at step 907, it is determined that Loop Count does not equal p, then flow continues to step 910 where the Loop Count is incremented. Flow then continues to step 902. If, at step 907, it is determined that Loop Count equals p, then flow continues to step 908 where the programming process of the page of the NAND memory array is complete.

Figure 10:
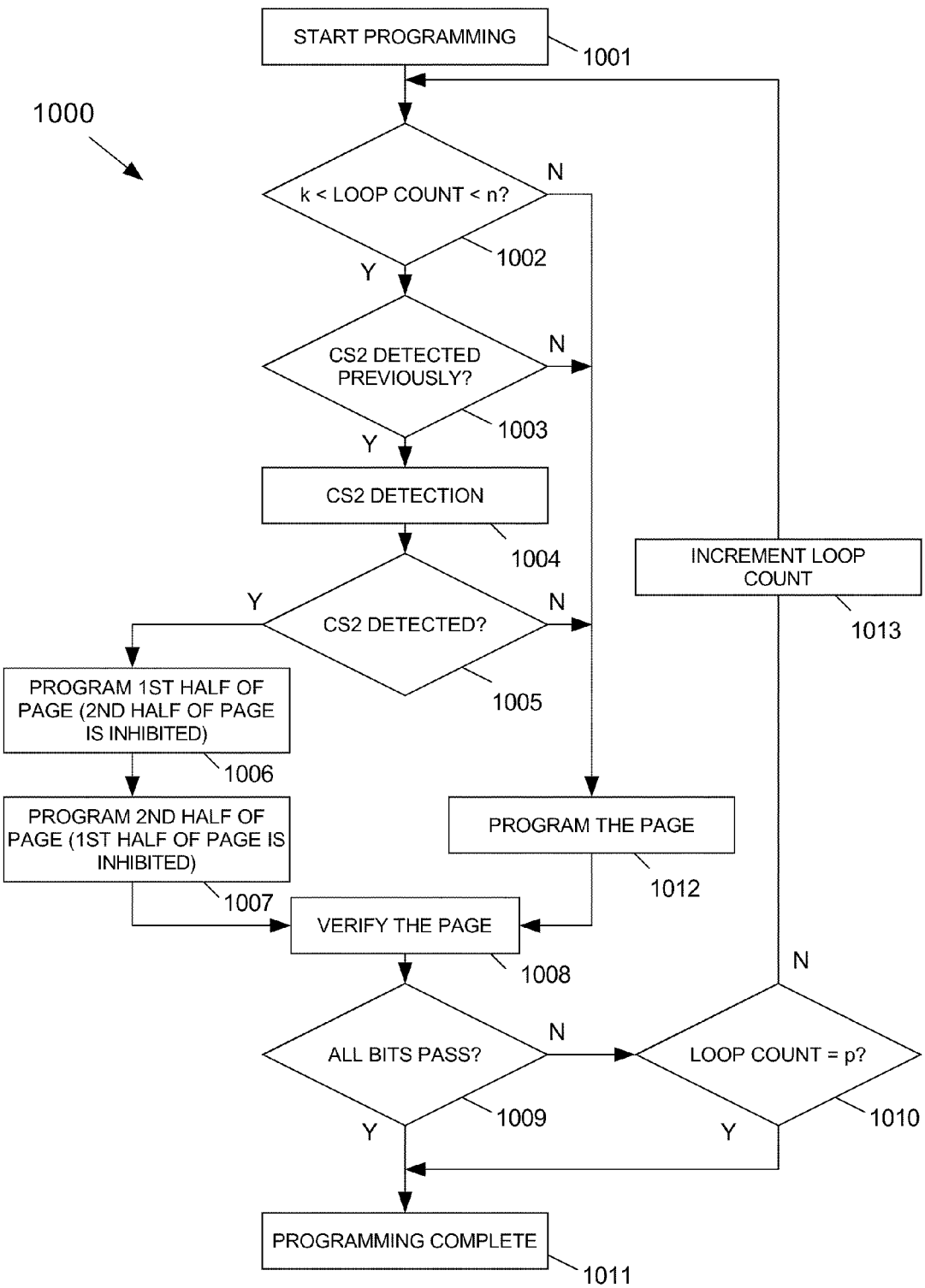
FIG. 10 shows a flow diagram of an exemplary embodiment of a programming process of a page of a NAND memory array based on a determination of is based on the detection of a CS2 data pattern according to the subject matter disclosed herein.

FIG. 10 shows a flow diagram 1000 of an exemplary embodiment of a programming process of a page of a NAND memory array based on a determination of is based on the detection of a CS2 data pattern according to the subject matter disclosed herein.

Figure 11:
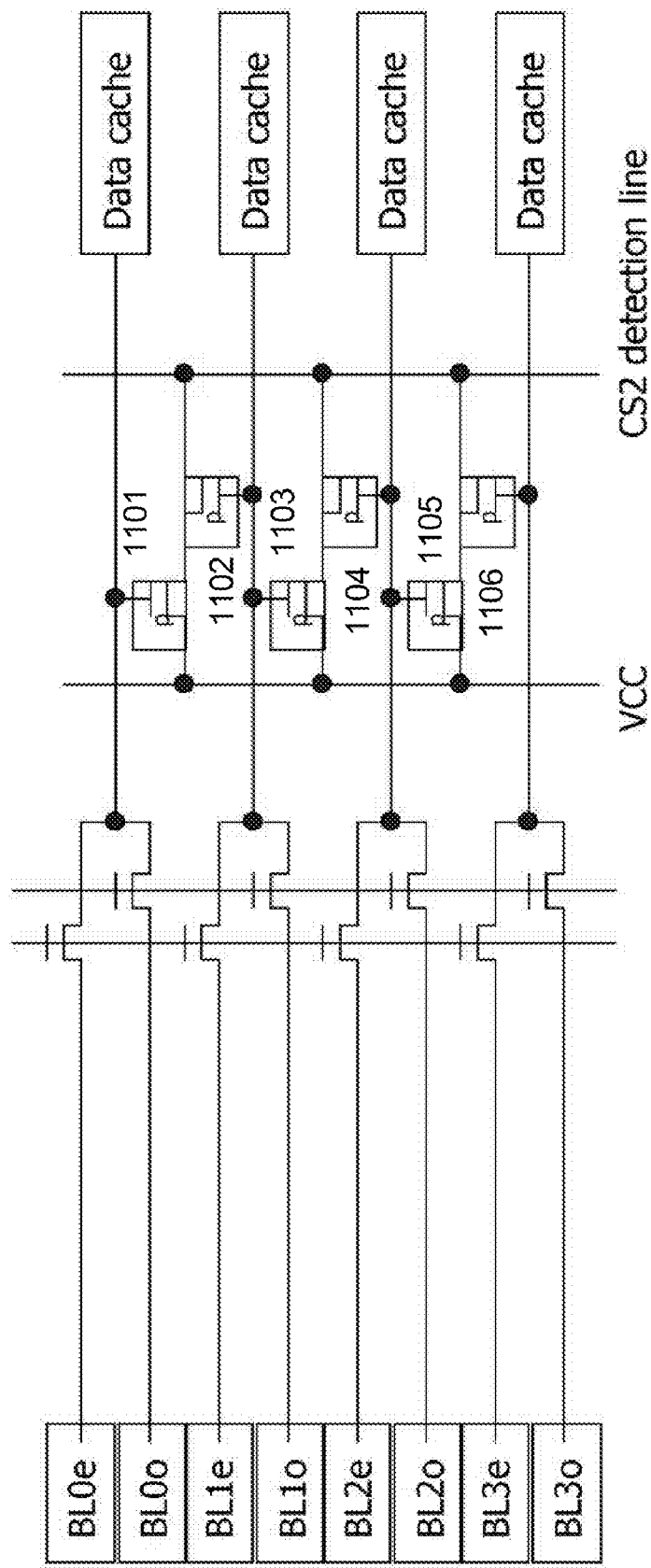
FIG. 11 depicts an exemplary circuit configuration for detecting a CS2 data pattern according to the subject matter disclosed herein.

FIG. 11 depicts an exemplary circuit configuration for detecting a CS2 data pattern according to the subject matter disclosed herein. In FIG. 11, a plurality PMOS series circuit is coupled between Vcc and a CS2 data pattern detection line. When any of the PMOS series circuits are conductive, CS2 data pattern detection line is coupled to Vcc. More specifically, a first PMOS series circuit is formed by PMOS transistors 1101 and 1102. When the data pattern appearing on bit lines BL0e (even), BL0o (odd), BL1e, and BL1o forms a CS2 data pattern, both transistors 1101 and 1102 are conductive, and CS2 data pattern detection line is coupled to Vcc. In one exemplary embodiment, CS2 data pattern detection line is enabled for a Loop Count of between k and n, in which k and n are predetermined values relating to the number of rows of a column page. In another exemplary embodiment, CS2 data pattern detection line is enabled when programming voltage Vpgm is between A and B in which A and B are predetermined values.

At step 1001 in FIG. 10, the programming process begins and a variable Loop Count is set to 1. The process flows to step 1002 where it is determined whether the whether Loop Count, i.e., the number of programming passes through the programming process of a column page of a NAND memory array, exceeds a predetermined number k and is less than a predetermined number n. In one exemplary embodiment, the particular values chosen for k and n could depend on observed manufacturing variations within a given manufacturing lot that contribute to a NAND memory array being susceptible to CS2 disturb failure. In another exemplary embodiment, the particular values chosen for k and n could depend on observed manufacturing variations taken over a large number of manufacturing lots that contribute to a NAND memory array being susceptible to CS2 disturb failure.

If, at step 1002, Loop Count is either less than k or greater than n, the process flows to step 1012 where the NAND column page is programmed using a conventional single-pulse programming technique. If, at step 1002, Loop Count is greater than k and less than n, the process flows to step 1003 where the CS2 detector is invoked and it is determined whether a CS2 data pattern was detected in the previous loop. If at step 1003, it is determined that a CS2 data pattern was not detected in the previous loop, flow continues to step 1012 where the NAND column page is programmed using a conventional single-pulse technique. If, at step 1003, it is determined that a CS2 data pattern was detected in the previous loop, flow continues to step 1004 where a CS2 data pattern detection process takes place. Flow continues to step 1005 where it is determined whether a CS2 data pattern detection was detected. If, at step 1005, a CS2 data pattern was not detected, flow continues to step 1012.

If, at step 1005, a CS2 data pattern was detected, flow continues to step 1006 where the first half of the NAND column page is programmed while the second half of the NAND column page is inhibited. Once step 1006 is complete, flow continues to step 1007 where the second half of the NAND column page is programmed while the first half of the NAND column page is inhibited.

Regardless whether the process flow is from step 1007 or from step 1012, the programming is verified at step 1008.

Flow continues to step 1009 where it is determined whether the programming performed in steps 1006 and 1007, or step 1012 is verified. If, at step 1009, it is determined that the programming is verified, flow continues to step 1001 where the programming process of the page of the NAND memory array is complete. If, at step 1009, it is determined that the programming is not verified, flow continues to step 1010 where it is determined whether the programming process for the column page is complete, that is, whether the Loop Count equals the number of rows p in the column page. If, at step 1010, it is determined that Loop Count does not equal p, then flow continues to step 1013 where the Loop Count is incremented. Flow then continues to step 1002. If, at step 1010, it is determined that Loop Count equals p, then flow continues to step 1011 where the programming process of the page of the NAND memory array is complete.

As described in connection with FIG. 11, CS2 detection could be enabled as a function of the Loop Count, and/or the magnitude of the programming voltage Vpgm.

Additionally, while the programming techniques disclosed herein have been described in connection with data patterns occurring in NAND memory arrays configured even and odd column pages, it should be understood that the programming techniques disclosed herein are also applicable to data patterns occurring in NAND memory arrays that are not configured in even and odd column pages.

Figure 12:
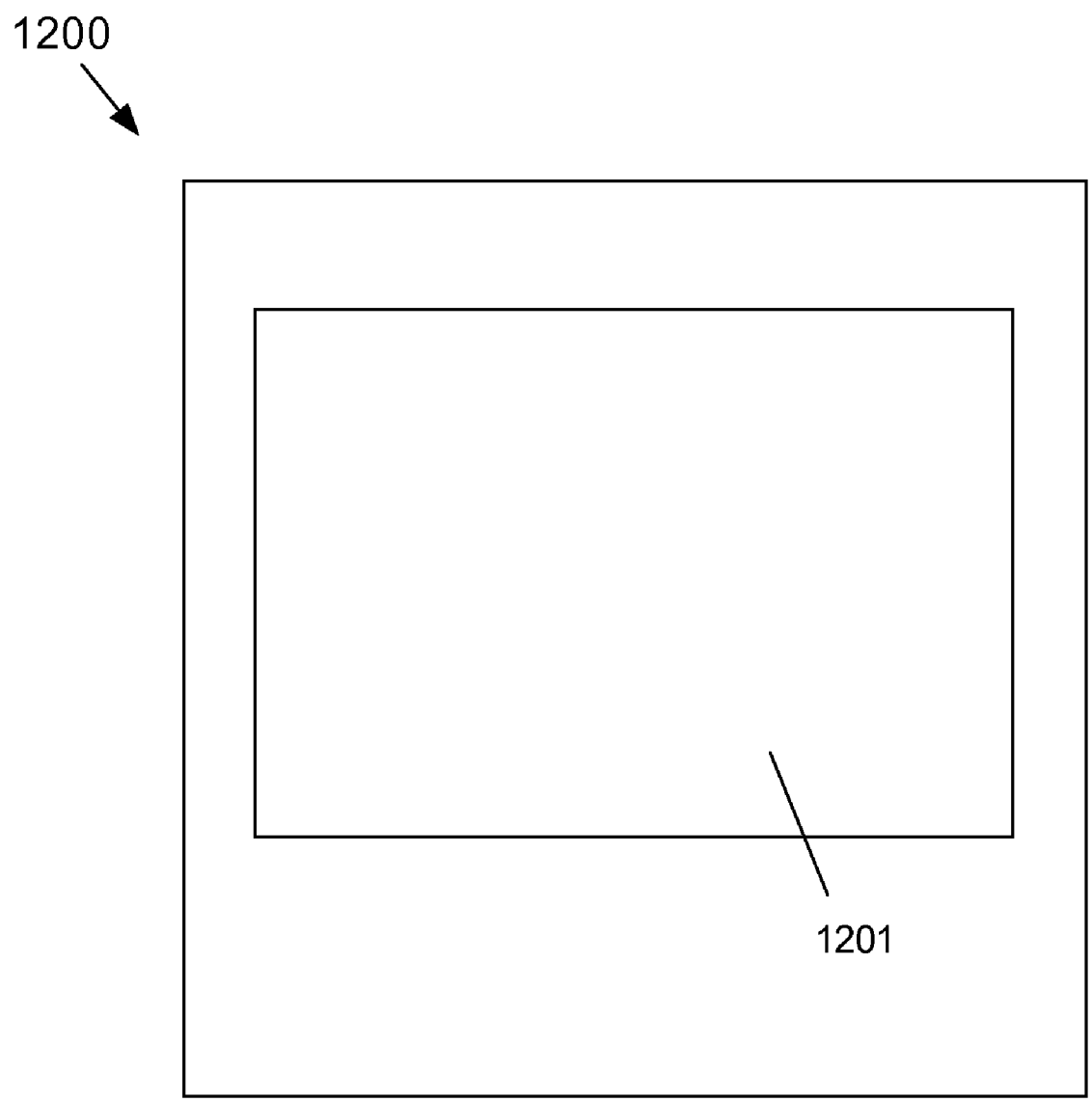
FIG. 12 depicts an article comprising: a computer-readable medium having stored thereon instructions that, if executed, result in any or a combination thereof, of the exemplary processes disclosed herein.

FIG. 12 depicts an article 1200 comprising: a computer-readable medium 1201 having stored thereon instructions that, if executed, result in any or a combination thereof, of the exemplary processes disclosed herein. In one exemplary embodiment, article 1200 comprises, but is not limited to, a magnetic storage device. In another exemplary embodiment, article 1200 comprises, but is not limited to, an optical storage device. In still anther exemplary embodiment, article 1200 comprises, but is not limited to, an electrical-based storage device.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method of programming a NAND memory array, comprising:
    selecting a word line of the NAND memory array to program at least two memory cells coupled to the word line, the word line being coupled to a plurality of memory cells;
    programming the at least two memory cells coupled to the word line by applying a programming voltage Vpgm as a double pulse to the word line if a data pattern associated with at least two memory cells that are to be programmed is a two-sided column-stripe (CS2) data pattern, a first memory cell of the at least two memory cells being programmed by the first programming voltage pulse and a second memory cell of the at least two memory cells being programmed by the second programming voltage pulse; and
    programming the at least two memory cells coupled to the word line by applying a programming voltage Vpgm as a single pulse to the word line if a data pattern associated with at least two memory cells that are to be programmed is not a two-sided column-stripe (CS2) data pattern.

2. The method according to claim 1, wherein the two-sided column-stripe (CS2) data pattern comprises a memory cell that is not to be programmed directly between two memory cells that are to be programmed, a channel associated with the memory cell that is not to be programmed having an applied boost voltage, and the channels associated with the two memory cells that are to be programmed having an applied programming voltage.

3. The method according to claim 2, further comprising applying the programming voltage Vpgm as the double pulse to the word line if a loop count associated with the programming of the NAND memory array is greater than a first predetermined value and less that a second predetermined value; and
    applying the programming voltage Vpgm as the single pulse to the word line if the loop count associated with the programming of the NAND array is less than the first predetermined value and greater than the second predetermined value.

4. The method according to claim 3, further comprising applying the programming voltage Vpgm as the double pulse to the word line if a magnitude of the programming voltage Vpgm is greater than a first predetermined magnitude and less that a second predetermined magnitude; and
    applying the programming voltage Vpgm as the single pulse to the word line if the magnitude of the programming voltage Vpgm is less than the first predetermined magnitude and greater that the second predetermined magnitude.

5. The method according to claim 2, further comprising applying the programming voltage Vpgm as the double pulse to the word line if a magnitude of the programming voltage Vpgm is greater than a first predetermined magnitude and less that a second predetermined magnitude; and
    applying the programming voltage Vpgm as the single pulse to the word line if the magnitude of the programming voltage Vpgm is less than the first predetermined magnitude and greater that the second predetermined magnitude.

6. The method according to claim 5, further comprising applying the programming voltage Vpgm as the double pulse to the word line if a loop count associated with the programming of the NAND memory array is greater than a first predetermined value and less that a second predetermined value; and
    applying the programming voltage Vpgm as the single pulse to the word line if the loop count associated with the programming of the NAND array is less than the first predetermined value and greater than the second predetermined value.

7. The method according to claim 2, further comprising applying the programming voltage Vpgm as the double pulse to the word line if the two-sided column-stripe (CS2) data pattern is detected; and
    applying the programming voltage Vpgm as the single pulse to the word line if the two-sided column-stripe (CS2) data pattern is not detected.

8. A method of programming a NAND memory array, comprising:
    selecting a word line of the NAND memory array to program at least two memory cells coupled to the word line, the word line being coupled to a plurality of memory cells;
    detecting a two-sided column-strip (CS2) data pattern, the two-sided column-stripe (CS2) data pattern comprising a memory cell that is not to be programmed directly between two memory cells that are to be programmed, a channel associated with the memory cell that is not to be programmed having an applied boost voltage, and the channels associated with the two memory cells that are to be programmed have an applied programming voltage;

programming the at least two memory cells coupled to the word line by applying a programming voltage Vpgm as a double pulse to the word line if a data pattern associated with at least two memory cells that are to be programmed is the two-sided column-stripe (CS2) data pattern; and programming the at least two memory cells coupled to the word line by applying a programming voltage Vpgm as a single pulse to the word line if a data pattern associated with at least two memory cells that are to be programmed is not a two-sided column-stripe (CS2) data pattern.

9. The method according to claim 8, wherein a first memory cell of the at least two memory cells being programmed by the first programming voltage pulse and a second memory cell of the at least two memory cells being programmed by the second programming voltage pulse.

10. The method according to claim 9, further comprising applying the programming voltage Vpgm as the double pulse to the word line if a loop count associated with the programming of the NAND memory array is greater than a first predetermined value and less that a second predetermined value; and applying the programming voltage Vpgm as the single pulse to the word line if the loop count associated with the programming of the NAND array is less than the first predetermined value and greater than the second predetermined value.

11. The method according to claim 10, wherein the NAND memory array comprises an even column page and an odd column page, wherein if the memory cell that is not to be programmed comprises part of the even column page, the two memory cells that are to be programmed comprise part of the odd column page, and wherein if the memory cell that is not to be programmed comprises part of the odd column page, the two memory cells that are to be programmed comprise part of the even column page.

12. The method according to claim 9, further comprising applying the programming voltage Vpgm as the double pulse to the word line if a magnitude of the programming voltage Vpgm is greater than a first predetermined magnitude and less that a second predetermined magnitude; and applying the programming voltage Vpgm as the single pulse to the word line if the magnitude of the programming voltage Vpgm is less than the first predetermined magnitude and greater that the second predetermined magnitude.

13. The method according to claim 12, wherein the NAND memory array comprises an even column page and an odd column page, wherein if the memory cell that is not to be programmed comprises part of the even column page, the two memory cells that are to be programmed comprise part of the odd column page, and wherein if the memory cell that is not to be programmed comprises part of the odd column page, the two memory cells that are to be programmed comprise part of the even column page.

* * * * *

UNITED STATES PATENT AND TRADEMARK OFFICE
CERTIFICATE OF CORRECTION

| | | |
|---|---|---|
| PATENT NO. | : 8,102,712 B2 | Page 1 of 1 |
| APPLICATION NO. | : 12/644408 | |
| DATED | : January 24, 2012 | |
| INVENTOR(S) | : Akira Goda et al. | |

It is certified that error appears in the above-identified patent and that said Letters Patent is hereby corrected as shown below:

On the cover page, item (56), in column 2, under "Other Publications", line 1, delete "Untied" and insert -- United --, therefor.

In column 12, line 13, in claim 3, delete "that" and insert -- than --, therefor.

In column 12, line 24, in claim 4, delete "that" and insert -- than --, therefor.

In column 12, line 28, in claim 4, delete "that" and insert -- than --, therefor.

In column 12, line 34, in claim 5, delete "that" and insert -- than --, therefor.

In column 12, line 38, in claim 5, delete "that" and insert -- than --, therefor.

In column 12, line 44, in claim 6, delete "that" and insert -- than --, therefor.

In column 13, line 28, in claim 10, delete "that" and insert -- than --, therefor.

In column 14, line 16, in claim 12, delete "that" and insert -- than --, therefor.

In column 14, line 20, in claim 12, delete "that" and insert -- than --, therefor.

Signed and Sealed this
Tenth Day of July, 2012

David J. Kappos
*Director of the United States Patent and Trademark Office*